(12) United States Patent
Jiang (10) Patent No.: US 9,698,278 B2
(45) Date of Patent: Jul. 4, 2017

(54) THIN FILM TRANSISTOR AND MANUFACTURING METHOD THEREOF, ARRAY SUBSTRATE, DISPLAY DEVICE

(71) Applicant: BOE Technology Group Co., Ltd., Beijing (CN)

(72) Inventor: Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 115 days.

(21) Appl. No.: 14/421,967

(22) PCT Filed: Apr. 10, 2014

(86) PCT No.: PCT/CN2014/075099
§ 371 (c)(1),
(2) Date: Feb. 16, 2015

(87) PCT Pub. No.: WO2015/096298
PCT Pub. Date: Jul. 2, 2015

(65) Prior Publication Data
US 2015/0349141 A1    Dec. 3, 2015

(30) Foreign Application Priority Data

Dec. 24, 2013  (CN) .......................... 2013 1 0718983

(51) Int. Cl.
*H01L 29/10* (2006.01)
*H01L 29/786* (2006.01)
(Continued)

(52) U.S. Cl.
CPC ...... *H01L 29/78696* (2013.01); *H01L 21/425* (2013.01); *H01L 21/426* (2013.01);
(Continued)

(58) Field of Classification Search
CPC ... H01L 21/425; H01L 21/426; H01L 21/477; H01L 27/1225; H01L 29/66742; H01L 29/66969; H01L 29/7869; H01L 29/78696
See application file for complete search history.

(56) References Cited

U.S. PATENT DOCUMENTS

2003/0218222 A1    11/2003  Wager et al.
2007/0252147 A1    11/2007  Kim et al.
(Continued)

FOREIGN PATENT DOCUMENTS

CN            1656618 A     8/2005
CN         101473444 A     7/2009
(Continued)

OTHER PUBLICATIONS

International Search Report and Written Opinion mailed Sep. 19, 2014 (PCT/CN2014/075099); ISA/CN.
(Continued)

*Primary Examiner* — Victor A Mandala
*Assistant Examiner* — Colleen E Snow
(74) *Attorney, Agent, or Firm* — Banner & Witcoff, Ltd.

(57) ABSTRACT

There are provided a thin film transistor and a manufacturing method thereof, an array substrate, a display device. The manufacturing method includes forming a gate electrode, a gate insulating layer, a metal oxide semiconductor active layer, a source electrode and a drain electrode on a substrate. The forming the metal oxide semiconductor active layer includes forming a zinc oxide-based binary metal oxide pattern layer on a substrate. The pattern layer includes a first pattern, a second pattern and a third pattern. Metal doping ions are implanted into the zinc oxide-based binary metal oxide pattern layer by using an ion implantation technology, so that a binary metal oxide of the third pattern is trans-
(Continued)

formed into a multi-element metal oxide semiconductor, and the metal oxide semiconductor active layer is formed.

19 Claims, 5 Drawing Sheets

(51) Int. Cl.
H01L 27/12 (2006.01)
H01L 29/66 (2006.01)
H01L 21/425 (2006.01)
H01L 21/426 (2006.01)
H01L 21/477 (2006.01)

(52) U.S. Cl.
CPC ........ *H01L 21/477* (2013.01); *H01L 27/1225* (2013.01); *H01L 29/66742* (2013.01); *H01L 29/66969* (2013.01); *H01L 29/7869* (2013.01)

(56) References Cited

U.S. PATENT DOCUMENTS

| | | |
|---|---|---|
| 2008/0108198 A1 | 5/2008 | Wager, III et al. |
| 2010/0117074 A1 | 5/2010 | Yamazaki et al. |
| 2010/0304528 A1 | 12/2010 | Kim et al. |
| 2011/0079778 A1 | 4/2011 | Yamazaki et al. |
| 2011/0101342 A1 | 5/2011 | Kim et al. |
| 2011/0101343 A1 | 5/2011 | Kim et al. |
| 2012/0287364 A1 | 11/2012 | Peng et al. |
| 2015/0001526 A1* | 1/2015 | Huang ............... H01L 29/45 257/43 |
| 2015/0069336 A1* | 3/2015 | Okumura ............ H01L 27/1225 257/43 |

FOREIGN PATENT DOCUMENTS

| | | |
|---|---|---|
| CN | 101908489 A | 12/2010 |
| CN | 102692771 A | 9/2012 |
| CN | 103354218 A | 10/2013 |
| CN | 103378162 A | 10/2013 |

OTHER PUBLICATIONS

Jan. 12, 2016—(CN)—First Office Action Appn No. 201310718983.8 with English Tran.
Jun. 28, 2016—International Preliminary Report on Patentability Appn PCT/CN2014/091906.
Jun. 27, 2016—(CN)—Second Office Action Appn 201310718983.8 with English Tran.
Jun. 28, 2016—International Preliminary Report on Patentability Appn PCT/CN2014/075099.

* cited by examiner

THIN FILM TRANSISTOR AND MANUFACTURING METHOD THEREOF, ARRAY SUBSTRATE, DISPLAY DEVICE

The application is a U.S. National Phase Entry of International Application No. PCT/CN2014/075099 filed on Apr. 10, 2014, designating the United States of America and claiming priority to Chinese Patent Application No. 201310718983.8 filed on Dec. 24, 2013. The present applications claims priority to and the benefit of the above-identified applications and the above-identified applications are incorporated by reference herein in their entirety.

TECHNICAL FIELD

Embodiments of the present invention relate to a thin film transistor and a manufacturing method thereof, an array substrate and a display device.

BACKGROUND

With the ceaseless increasing of size of a display and the ceaseless raising of frequency of a driving circuit, it has become difficult for mobility of an existing amorphous silicon thin film transistor to meet the demands.

As regards high-mobility Thin Film Transistors (TFTs), there are polycrystalline silicon TFTs and metal oxide TFTs. However, polycrystalline silicon TFTs have poor uniformity and a complex manufacturing process, and they are limited by laser crystallization equipment and the like, which counts against large-scale production. While metal oxide TFTs being transparent possess a high mobility, good uniformity, and a simple manufacturing process, and can meet the demands of large-size Liquid Crystal Displays (abbreviatedly referred to as LCDs), Organic Light Emitting Diodes (abbreviatedly referred to as OLEDs) and Polymer Light Emitting Diode displays (abbreviatedly referred to as PLEDs) better, and thus, they get a wide attention.

Under normal circumstances, in terms of a thin film transistor, a certain energy barrier may be formed on contact surfaces between source and drain electrodes and a semiconductor active layer, so as to form contact resistances; and the energy barrier can hinder the motion of carriers. When the energy barrier at the interface is larger and Schottky contact is formed, it easily brings about the loss of signal, and thus performance of TFTs is affected.

In addition, in the course of manufacture of an existing metal oxide TFT, a subsequent manufacturing process may cause damage to a metal oxide semiconductor active layer, resulting in deterioration of the performance of the TFT.

Therefore, how to guarantee the performance of TFTs is very important.

SUMMARY

According to embodiments of the present invention, there are provided a thin film transistor and a manufacturing method thereof, an array substrate and a display device, by which, the problem of contact resistance between source and drain electrodes and a semiconductor active layer can be solved, simultaneous with avoidance of the damage to the semiconductor active layer during manufacture.

In order to achieve the above purpose, embodiments of the invention adopt the following technical schemes:

On the one hand, there is provided a thin film transistor, comprising a gate electrode, a gate insulating layer, a metal oxide semiconductor active layer, a source electrode and a drain electrode that are provided on a substrate; wherein, the metal oxide semiconductor active layer is disposed between the substrate and the source electrode and the drain electrode, and corresponds to a gap between the source electrode and the drain electrode; the thin film transistor further includes a first pattern and a second pattern that are disposed in the same layer and contact with the metal oxide semiconductor active layer; the first pattern corresponds to and contacts directly with the source electrode, and the second pattern corresponds to and contacts directly with the drain electrode. The first pattern and the second pattern each include a zinc oxide-based binary metal oxide, the metal oxide semiconductor active layer includes a zinc oxide-based multi-element metal oxide semiconductor, and the zinc oxide-based multi-element metal oxide is a metal oxide obtained by injecting metal doping ions into the zinc oxide-based binary metal oxide.

For example, in a cross section taken along an interval direction of the source electrode and the drain electrode, the metal oxide semiconductor active layer has a width the same as a gap width between the source electrode and the drain electrode.

Optionally, the thin film transistor is of bottom gate type; the thin film transistor further includes a protective layer disposed over the source electrode and the drain electrode.

Optionally, the thin film transistor is of top gate type.

Further optionally, the zinc oxide-based binary metal oxide includes Indium Zinc Oxide (briefly called as IZO), Aluminum Zinc Oxide (briefly called as AZO), Gallium Zinc Oxide (briefly called as GZO) or Tin Zinc Oxide (briefly called as TZO); the metal doping ions include at least one of gallium ions ($Ga^{3+}$), tin ions ($Sn^{2+}$), hafnium ions ($Hf^{4+}$), aluminum ions ($Al^{3+}$) or indium ions ($In^{3+}$).

For example, in a cross section along an interval direction of the source electrode and the drain electrode, edges at both sides of the metal oxide semiconductor active layer are aligned with edges of the source electrode and the drain electrode in opposition, respectively.

There is further provided an array substrate, comprising the thin film transistor as stated above.

There is further provided a display device, comprising the array substrate as stated above.

In another aspect, there is provided a manufacturing method of the above thin film transistor, comprising forming a gate electrode, a gate insulating layer, a metal oxide semiconductor active layer, a source electrode and a drain electrode on a substrate. forming the metal oxide semiconductor active layer on the substrate includes: forming a zinc oxide-based binary metal oxide pattern layer on the substrate, wherein, the pattern layer includes a first pattern corresponding to the source electrode, a second pattern corresponding to the drain electrode, and a third pattern corresponding to a gap between the source electrode and the drain electrode, and the zinc oxide-based binary metal oxide pattern layer contacts directly with the source electrode and the drain electrode; and, with an insulating layer formed above the source electrode and the drain electrode as a barrier layer, implanting metal doping ions into the zinc oxide-based binary metal oxide pattern layer by using an ion implantation technology, so that the zinc oxide-based binary metal oxide of the third pattern is transformed into a zinc oxide-based multi-element metal oxide semiconductor, and the metal oxide semiconductor active layer is formed.

Optionally, the thin film transistor is of bottom gate type. The method further includes forming a protective layer on the substrate with the source electrode and the drain electrode formed thereon; wherein, implanting metal doping ions into the zinc oxide-based binary metal oxide pattern layer by using an ion implantation technology with the insulating layer formed above the source electrode and the drain electrode as a barrier layer, so that the zinc oxide-based binary metal oxide of the third pattern is transformed into the zinc oxide-based multi-element metal oxide semiconductor, and the metal oxide semiconductor active layer is formed, includes: with the protective layer as a barrier layer, implanting metal doping ions into the zinc oxide-based binary metal oxide pattern layer by using an ion implantation technology, so that the zinc oxide-based binary metal oxide of the third pattern that is not blocked by the source electrode and the drain electrode is transformed into the zinc oxide-based multi-element metal oxide semiconductor, and the metal oxide semiconductor active layer is formed.

Optionally, the thin film transistor is of top gate type. Implanting metal doping ions being implanted into the zinc oxide-based binary metal oxide pattern layer by using an ion implantation technology with the insulating layer formed above the source electrode and the drain electrode as a barrier layer, so that the zinc oxide-based binary metal oxide of the third pattern is transformed into the zinc oxide-based multi-element metal oxide semiconductor, and the metal oxide semiconductor active layer is formed, includes: with the gate insulating layer as a barrier layer, implanting metal doping ions into the zinc oxide-based binary metal oxide pattern layer by using an ion implantation technology, so that the zinc oxide-based binary metal oxide of the third pattern that is not blocked by the source electrode and the drain electrode is transformed into the zinc oxide-based multi-element metal oxide semiconductor, and the metal oxide semiconductor active layer is formed.

Further optionally, after implanting metal doping ions into the zinc oxide-based binary metal oxide pattern layer by using an ion implantation technology, the method further includes conducting an annealing treatment.

Further, the zinc oxide-based binary metal oxide includes indium zinc oxide IZO, aluminum zinc oxide AZO, gallium zinc oxide GZO or tin zinc oxide TZO; the metal doping ions include at least one of $Ga^{3+}$, $Sn^{2+}$, $Hf^{4+}$, $Al^{3+}$ or $In^{3+}$.

According to embodiments of the invention, there are provided a thin film transistor and a manufacturing method thereof, an array substrate and a display device. The manufacturing method includes forming a gate electrode, a gate insulating layer, a metal oxide semiconductor active layer, a source electrode and a drain electrode on a substrate. Forming the metal oxide semiconductor active layer on the substrate may include: forming a zinc oxide-based binary metal oxide pattern layer on the substrate, wherein, the pattern layer includes a first pattern corresponding to the source electrode, a second pattern corresponding to the drain electrode, and a third pattern corresponding to a gap between the source electrode and the drain electrode, and the zinc oxide-based binary metal oxide pattern layer contacts directly with the source electrode and the drain electrode; with an insulating layer formed above the source electrode and the drain electrode as a barrier layer, metal doping ions are implanted into the zinc oxide-based binary metal oxide pattern layer by using an ion implantation technology, so that the zinc oxide-based binary metal oxide of the third pattern is transformed into a zinc oxide-based multi-element metal oxide semiconductor, and the metal oxide semiconductor active layer is formed.

In embodiments of the invention, on the one hand, in view of the fact that the zinc oxide-based binary metal oxide is a conductive material, when the zinc oxide-based binary metal oxide of the third pattern is transformed into a zinc oxide-based multi-element metal oxide semiconductor through ion implantation, a region for transition from conductor to semiconductor is formed below the source electrode and the drain electrode. As such, a transition layer, with which transmission of carriers is provided, is formed below the source electrode and the drain electrode, and the problem of contact resistances between the metal oxide semiconductor active layer and the source electrode and the drain electrode is solved effectively. On the other hand, with an insulating layer formed above the source electrode and the drain electrode as a barrier layer, the metal oxide semiconductor active layer is formed by an ion implantation technology, not only damage to the metal oxide semiconductor active layer that might be caused during the ion implantation can be avoided, but also an effect that may be brought about on the metal oxide semiconductor active layer by other subsequent process during manufacture of the thin film transistor can be prevented. Thus, performance of the thin film transistor is enhanced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

FIG. 1(*a*) is a schematic view illustrating a kind of execution of ion implantation provided by an embodiment of the invention;

FIG. 1(*b*) is a structurally schematic view illustrating a thin film transistor provided by an embodiment of the invention;

FIG. 2(*a*) is a schematic view illustrating another kind of execution of ion implantation provided by an embodiment of the invention;

FIG. 2(*b*) is a structurally schematic view illustrating another thin film transistor provided by an embodiment of the invention;

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

According to an embodiment of the invention, there is provided a manufacturing method of a thin film transistor 10, which includes forming a gate electrode 101, a gate insulating layer 102, a metal oxide semiconductor active layer 103, a source electrode 104 and a drain electrode 105 on a substrate.

The formation of the metal oxide semiconductor active layer 103 on the substrate may include forming a pattern layer 1030 of a zinc oxide-based binary metal oxide on the substrate. The pattern layer includes a first pattern 1031 corresponding to the source electrode 104, a second pattern 1032 corresponding to the drain electrode 105 and a third pattern 1033 corresponding to a gap between the source electrode 104 and the drain electrode 105, and the pattern layer 1030 of the zinc oxide-based binary metal oxide is in direct contact with the source electrode 104 and the drain electrode 105. With an insulating layer formed above the source electrode 104 and the drain electrode 105 as a barrier layer, metal doping ions are implanted into the pattern layer 1030 of the zinc oxide-based binary metal oxide by using an ion implantation technology, so as to transform the zinc oxide-based binary metal oxide of the third pattern 1033 into a zinc oxide-based multi-element metal oxide semiconductor. Thus, the metal oxide semiconductor active layer 103 is formed.

As illustrated in FIG. 1(a) to FIG. 2(b), the third pattern 1033 or the formed metal oxide semiconductor active layer 103 corresponds to the gap between the source electrode 104 and the drain electrode 105. For example, in a cross section along an interval direction of the source electrode 104 and the drain electrode 105, the width of the metal oxide semiconductor active layer 103 is the same as a gap width between the source electrode 104 and the drain electrode 105. For example, in a cross section along an interval direction of the source electrode 104 and the drain electrode 105, edges at both sides of the metal oxide semiconductor active layer 103 are aligned with edges of the source electrode 104 and the drain electrode 105 in opposition, respectively.

It is to be noted that, the zinc oxide-based binary metal oxide refers to such a binary metal oxide that is formed by doping zinc oxide as the matrix with other metal element; here, the zinc oxide-based binary metal oxide is a conductive material.

The pattern layer 1030 of a zinc oxide-based binary metal oxide includes three portions (i.e. the first pattern 1031, the second pattern 1032 and the third pattern 1033), and these three portions are distinguished merely by the structure, and independent of the constituent materials. After ion implantation is conducted, the material of the third pattern 1033 is transformed from the zinc oxide-based binary metal oxide into the zinc oxide-based multi-element metal oxide semiconductor; but for the thin film transistor 10, it still keeps the original pattern shape and lies in the former position.

The pattern layer 1030 of a zinc oxide-based binary metal oxide being in direct contact with the source electrode 104 and the drain electrode 105 means that, the first pattern 1031 and the second pattern 1032 of the pattern layer 1030 of the zinc oxide-based binary metal oxide are in direct contact with the source electrode 104 and the drain electrode 105, respectively, while the third pattern 1033 is exposed by a gap between the source electrode 104 and the drain electrode 105.

Taking an insulating layer formed above the source electrode 104 and the drain electrode 105 as a barrier layer means that, when the thin film transistor 10 is manufactured, the source electrode 104 and the drain electrode 105 are formed earlier, and then the barrier layer is formed.

During the ion implantation, it is required that an insulating layer be taken as a barrier layer. The reason for this is that metal doping ions for ion implantation have a very high energy, and in case that an ion implantation is conducted directly without provision of a barrier layer, damage to a semiconductor active layer may be caused by an over-high bombarding energy of ions, and in turn, performance of the thin film transistor 10 is affected. Thus, during the ion implantation, a medium serving a barrier function is needed. Here, the barrier layer may be an insulating layer with barrier function of any kind.

Depending on the type of the thin film transistor, when it has already contained an insulating layer having a barrier function in itself, the insulating layer may be directly used as a barrier layer; and when an insulating layer contained in itself cannot be used as a barrier layer, an insulating layer having a barrier function may be manufactured renewedly.

As regards the method of forming the metal oxide semiconductor active layer 103 by using an ion implantation technology, it is adaptable to thin film transistors of any of kinds including a bottom-gate type and a top-gate type, and no limit will be set here. The specific process may be designed according to the actual construction of a thin film transistor.

According to an embodiment of the invention, there is provided a manufacturing method of a thin film transistor 10, which includes forming a gate electrode 101, a gate insulating layer 102, a metal oxide semiconductor active layer 103, a source electrode 104 and a drain electrode 105 on a substrate. The formation of the metal oxide semiconductor active layer 103 on the substrate may include forming a pattern layer 1030 of a zinc oxide-based binary metal oxide on the substrate. The pattern layer includes a first pattern 1031 corresponding to the source electrode 104, a second pattern 1032 corresponding to the drain electrode 105 and a third pattern 1033 corresponding to a gap between the source electrode 104 and the drain electrode 105, and the pattern layer 1030 of the zinc oxide-based binary metal oxide is in direct contact with the source electrode 104 and the drain electrode 105. With an insulating layer formed above the source electrode 104 and the drain electrode 105 as a barrier layer, metal doping ions are implanted into the pattern layer 1030 of the zinc oxide-based binary metal oxide by using an ion implantation technology, so as to transform the zinc oxide-based binary metal oxide of the third pattern 1033 into a zinc oxide-based multi-element metal oxide semiconductor. Thus, the metal oxide semiconductor active layer 103 is formed.

In embodiments of the invention, on the one hand, owing to the fact that the zinc oxide-based binary metal oxide is a conductive material, when the zinc oxide-based binary metal oxide of the third pattern 1033 is transformed into a zinc oxide-based multi-element metal oxide semiconductor through ion implantation, it is equivalent to the case where a region for transition from conductor to semiconductor is formed below the source electrode 104 and the drain electrode 105. In this way, a transition layer, with which transmission of carriers can be provided, is formed below the source electrode 104 and the drain electrode 105, so as to solve the problem of contact resistances between the metal oxide semiconductor active layer 103 and the source electrode 104 and the drain electrode 105 effectively. In another aspect, with an insulating layer as a barrier layer, the metal oxide semiconductor active layer 103 is formed by an ion implantation technology, and by doing this, not only damage to the metal oxide semiconductor active layer 103 that may be caused during the ion implantation can be avoided, but also an effect on the metal oxide semiconductor active layer 103 that may be brought about by other subsequent process during manufacture of the thin film transistor 10 can be avoided. Thus, the performance of the thin film transistor 10 is enhanced.

Optionally, as illustrated in FIG. 1(a) and FIG. 1(b), the method may concretely include forming the gate electrode 101, the gate insulating layer 102, the pattern layer 1030 of the zinc oxide-based binary metal oxide, the source electrode 104 and the drain electrode 105 on a substrate in sequence, and forming a protective layer 106 above the source electrode 104 and the drain electrode 105.

The pattern layer 1030 of the zinc oxide-based binary metal oxide includes the first pattern 1031 corresponding to and in direct contact with the source electrode 104, the second pattern 1032 corresponding to and in direct contact with the drain electrode 105, and the third pattern 1033 corresponding to a gap between the source electrode 104 and the drain electrode 105.

In this case, upon formation of the metal oxide semiconductor active layer 103, referring to that illustrated in FIG. 1(a), it is possible that taking the protective layer 106 as a barrier layer, metal doping ions are implanted into the pattern layer 1030 of the zinc oxide-based binary metal oxide by using an ion implantation technology, so that the zinc oxide-based binary metal oxide of the third pattern 1033 that is not blocked by the source electrode 104 and the drain electrode 105 is transformed into the zinc oxide-based multi-element metal oxide semiconductor. Thus, the metal oxide semiconductor active layer 103 is formed, and in turn, a bottom-gate type thin film transistor with reference to that illustrated in FIG. 1(b) is obtained.

Here, the implanting dosage and bombarding energy of metal doping ions need to be controlled strictly. Its implanting dosage may be in direct proportion to contents of two metals in the zinc oxide-based binary metal oxide; and for its bombarding energy, it is required for it to ensure that a majority of the metal doping ions can enter the third pattern 1033 of the pattern layer 1030 of zinc oxide-based binary metal oxide, and thereby are combined with the zinc oxide-based binary metal oxide to form the zinc oxide-based multi-element metal oxide semiconductor. Therefore, in the course of conducting an ion implantation, the operation may be performed by using a way of high energy and deep implantation according to actual situations.

Because metal doping ions have a very high bombarding energy during the ion implantation, a majority of the metal doping ions can penetrate the protective layer 106 directly and enter the third pattern 1033 that is not blocked by the source electrode 104 and the drain electrode 105. In view of the fact that the source electrode 104 and the drain electrode 105 have already been formed above the pattern layer 1030 of zinc oxide-based binary metal oxide, the metal doping ions penetrating the protective layer 106 are blocked by the source electrode 104 and the drain electrode 105, so that the metal doping ions cannot be injected into the first pattern 1031 corresponding to the source electrode 104 and the second pattern 1032 corresponding to the drain electrode 105, and they are merely injected into the third pattern 1033 that is not blocked by the source electrode 104 and the drain electrode 105. Thus, only the zinc oxide-based binary metal oxide of the third pattern 1033 is transformed into the zinc oxide-based multi-element metal oxide semiconductor, and the metal oxide semiconductor active layer 103 is formed.

As can be known from the above descriptions, after the ion implantation, material of the third pattern 1033 is a zinc oxide-based multi-element metal oxide semiconductor material, and material of the first pattern 1031 and the second pattern 1032 is a zinc oxide-based binary metal oxide conductive material. Because the first pattern 1031 is in direct contact with the source electrode 104 and the second pattern 1032 is in direct contact with the drain electrode 105, it may be regarded that the source electrode 104 further includes the first pattern 1031, and the drain electrode 105 further includes the second pattern 1032.

Optionally, as illustrated in FIG. 2(a) and FIG. 2(b), specifically, the method may also include forming the pattern layer 1030 of zinc oxide-based binary metal oxide, the source electrode 104 and the drain electrode 105, the gate insulating layer 102 and the gate electrode 101 on a substrate in sequence.

The pattern layer 1030 of zinc oxide-based binary metal oxide includes the first pattern 1031 corresponding to and in direct contact with the source electrode 104, the second pattern 1032 corresponding to and in direct contact with the drain electrode, and the third pattern 1033 corresponding to a gap between the source electrode 104 and the drain electrode 105.

In this case, upon formation of the metal oxide semiconductor active layer 103, referring to that illustrated in FIG. 2(a), it is possible that after formation of the gate insulating layer 102, taking the gate insulating layer 102 as a barrier layer, metal doping ions are implanted into the pattern layer 1030 of the zinc oxide-based binary metal oxide by using an ion implantation technology, so that the zinc oxide-based binary metal oxide of the third pattern 1033 that is not blocked by the source electrode 104 and the drain electrode 105 is transformed into the zinc oxide-based multi-element metal oxide semiconductor. Thus, the metal oxide semiconductor active layer 103 is formed. Afterwards, the gate electrode 201 is formed over the gate insulating layer 102, so as to obtain a top-gate type thin film transistor with reference to that illustrated in FIG. 2(b).

Here, the source electrode 104 and the drain electrode 105 are located above the pattern layer 1030 of zinc oxide-based binary metal oxide. When metal doping ions are implanted into the pattern layer 1030 of zinc oxide-based binary metal oxide by using an ion implantation technology, the metal doping ions penetrating the gate insulating layer 102 are blocked by the source electrode 104 and the drain electrode 105, so that the metal doping ions cannot be injected into the first pattern 1031 corresponding to the source electrode 104 and the second pattern 1032 corresponding to the drain electrode 105, and they are merely injected into the third pattern 1033 that is not blocked by the source electrode 104 and the drain electrode 105. Thus, only the zinc oxide-based binary metal oxide of the third pattern 1033 is transformed into the zinc oxide-based multi-element metal oxide semiconductor, and the metal oxide semiconductor active layer 103 is formed.

As can be known from the above descriptions, after the ion implantation, material of the third pattern 1033 is a zinc oxide-based multi-element metal oxide semiconductor material, and material of the first pattern 1031 and the second pattern 1032 is a zinc oxide-based binary metal oxide conductive material. Because the first pattern 1031 is in direct contact with the source electrode 104 and the second pattern 1032 is in direct contact with the drain electrode 105, it may be regarded that the source electrode 104 further includes the first pattern 1031, and the drain electrode 105 further includes the second pattern 1032.

Further optionally, after metal doping ions are implanted into the pattern layer 1030 of zinc oxide-based binary metal oxide by using an ion implantation technology, the method may further include conducting an annealing treatment.

The structure of the zinc oxide-based multi-element metal oxide semiconductor directly formed after the ion implantation is out of order. Its microstructure can be homogenized when subjected to an annealing treatment, so that carriers of the zinc oxide-based multi-element metal oxide semiconductor lie in an effective, conductive position. In turn, this enables the performance of the thin film transistor 10 to be optimized.

Further optionally, the zinc oxide-based binary metal oxide may include IZO, AZO, GZO or TZO; and the metal doping ions may include at least one of $Ga^{3+}$, $Sn^{2+}$, $Hf^{4+}$, $Al^{3+}$ or $In^{3+}$.

At present, for the zinc oxide-based binary metal oxide, IZO, AZO, GZO and TZO are all metal oxide semiconductor active layer materials that are more widely researched. However, because its performance as a semiconductor active layer is not stable, metal doping elements may usually be added into the above zinc oxide-based binary metal oxide. Thus, a semiconductor material with stable characteristics such as IGZO, ITZO, HIZO, ATZO, ATZIO or the like is formed.

It is to be noted that, in terms of a semiconductor material, control of the conductive properties of the semiconductor material can be realized by means of controlling the concentration of carriers inside it. When the concentration of carriers inside the semiconductor material is larger than a certain critical value, it shows the characteristics of a conductor. In embodiments of the invention, material for the pattern layer 1030 of the zinc oxide-based binary metal oxide may include IZO, AZO, GZO and TZO, and what is utilized in this case are its conductor properties. After a metal doping element is added, the zinc oxide-based multi-element metal oxide semiconductor is formed, and only in this case can it show its semiconductor properties.

A manufacturing method of the thin film transistor 10 in the invention will be specifically described below by providing two concrete embodiments.

Figure 3:
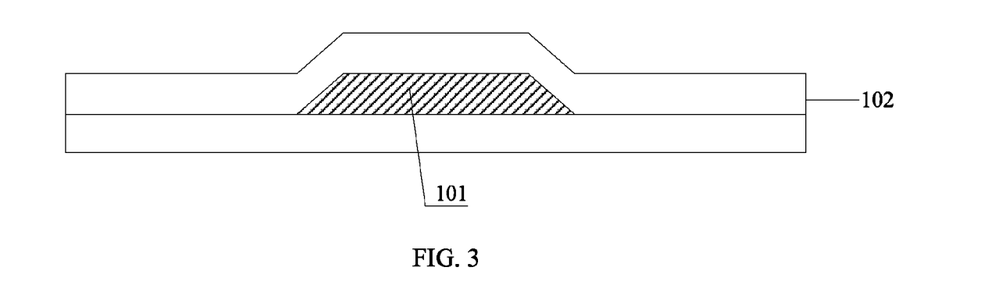
FIG. 3 to FIG. 5 are schematic views illustrating a process of forming a thin film transistor provided by an embodiment of the invention.

On the one hand, when the thin film transistor 10 is of a bottom gate type, the zinc oxide-based binary metal oxide is IZO, and the metal doping ions are $Ga^{3+}$, the method specifically includes:

S101, as illustrated in FIG. 3, a pattern including a gate electrode 101 is formed on a base substrate through one patterning process; and a gate insulating layer 102 is formed on the substrate with the gate electrode 101 formed thereon.

At the same time that the gate electrode 101 is formed, a gate line, a gate-line lead wire and so on are formed besides. Of course, a common electrode line may also be formed.

Here, a layer of metal thin film with a thickness of 1000 Å to 7000 Å may be deposited on a base substrate by way of magnetron sputtering; wherein, the metal thin film may usually adopt chromium, titanium, molybdenum, tungsten, aluminum, copper, an alloy of aluminum and nickel, an alloy of molybdenum and tungsten, an alloy of tungsten and copper, or other metal or alloy material. Exposure, development, etching, stripping-off and other treatment of a patterning process and conducted by using a mask, so as to form the gate electrode 101, the gate line (not illustrated in the figure), the gate-line lead wire and other pattern. Next, a layer of insulating thin film with a thickness of 1000 Å to 6000 Å may be deposited on the substrate with the pattern including the gate electrode 101 formed thereon by a chemical vapor deposition method. Material for the insulating thin film is usually silicon nitride, and silicon oxide, silicon oxynitride or the like may also be used for it.

Figure 4:
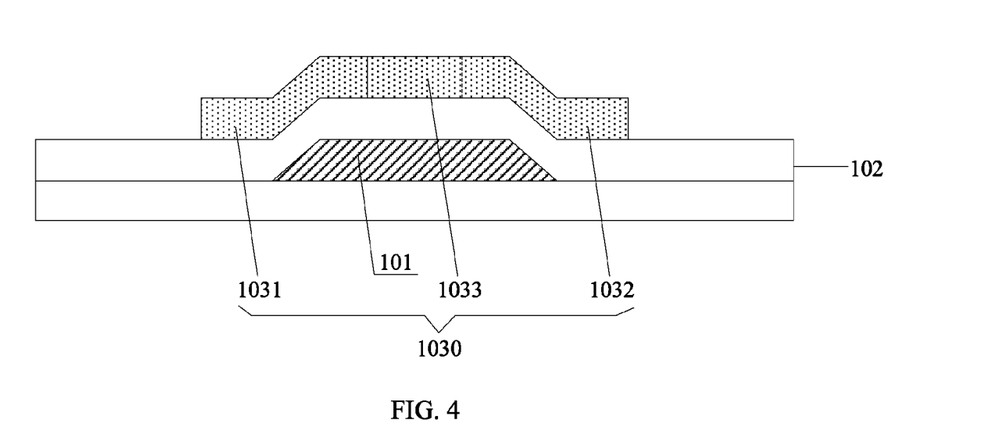

S102, as illustrated in FIG. 4, on the substrate subjected to the step S101, an IZO binary metal oxide thin film is formed, and is subjected to one patterning process, so as to form a pattern layer 1030 of IZO binary metal oxide.

The pattern layer 1030 of IZO binary metal oxide includes a first pattern 1031 corresponding to the source electrode 104 to be formed, a second pattern 1032 corresponding to the drain electrode 105 to be formed, and a third pattern 1033 corresponding to a gap between the source electrode 104 and the drain electrode that are to be formed.

Here, it is possible that a layer of IZO metal oxide thin film with a thickness of 1000 Å to 6000 Å is deposited on the substrate with the gate insulating layer 102 formed thereon by using a chemical vapor deposition method; and is subjected to exposure, development, etching, stripping-off and other patterning process treatment with a mask, so as to form the pattern layer 1030 of IZO binary metal oxide.

It is to be noted that, etching of a source/drain metal layer may be conducted in the course of a subsequent manufacturing process. While IZO is a material that is not sensitive to a metal etching liquid, and so, there is no need to prepare an etch stop layer, and metal etching can be carried out directly. As compared with the prior art, one patterning process can be reduced in this way, thereby enhancing the mass-production efficiency, and saving the cost.

Figure 5:
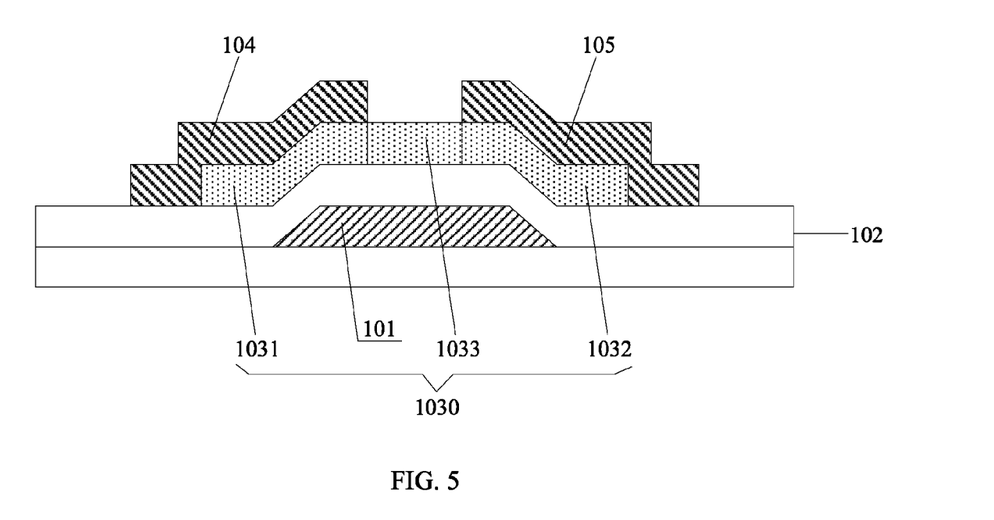

S103, as illustrated in FIG. 5, on the substrate subjected to the step S102, a source/drain metal layer thin film is formed, and subjected to one patterning process, so as to form a source electrode 104 and a drain electrode 105.

The first pattern 1031 and the second pattern 1032 of the pattern layer 1030 of IZO binary metal oxide correspond to and contact directly with the source electrode 104 and the drain electrode 105, respectively.

Here, it is possible that a layer of metal thin film with a thickness of 1000 Å to 7000 Å is deposited on the substrate with the pattern layer 1030 of IZO binary metal oxide formed thereon by a magnetron sputtering method; and is subjected to exposure, development, etching, stripping-off and other patterning process treatment with a mask, so as to form the source electrode 104 corresponding to and in direct contact with the first pattern 1031, and the drain electrode 105 corresponding to and in direct contact with the second pattern 1032.

S104, referring to that illustrated in FIG. 1(a), on the substrate subjected to the step S103, a protective layer 106 is formed.

Here, a layer of protective layer thin film with a thickness of 1000 Å to 6000 Å may be deposited on the substrate with the source electrode 104 and the drain electrode 105 formed thereon by using a chemical vapor deposition method. The material for the protective layer thin film is usually silicon nitride, and one or more of silicon oxide, silicon oxynitride, aluminum oxide and other insulating materials may also be used.

S105, referring to that illustrated in FIG. 1(a), on the substrate subjected to the step S104, with the protective layer 106 as a barrier layer, $Ga^{3+}$ is implanted into the pattern layer 1030 of IZO binary metal oxide by using an ion implantation technology, and an annealing treatment is conducted, so as to transform the IZO of the third pattern 1033 into the IGZO semiconductor. Thus, a metal oxide semiconductor active layer 103 is formed, and the structure of thin film transistor 10 referring to that illustrated in FIG. 1(b) is obtained.

On the basis of the above steps S101 to S105, a thin film transistor 10 having a bottom-gate structure may be formed. The metal oxide semiconductor active layer 103 includes IGZO semiconductor, the source electrode 104 further includes the first pattern 1031, and the drain electrode 105 further includes the second pattern 1032.

Figure 6:
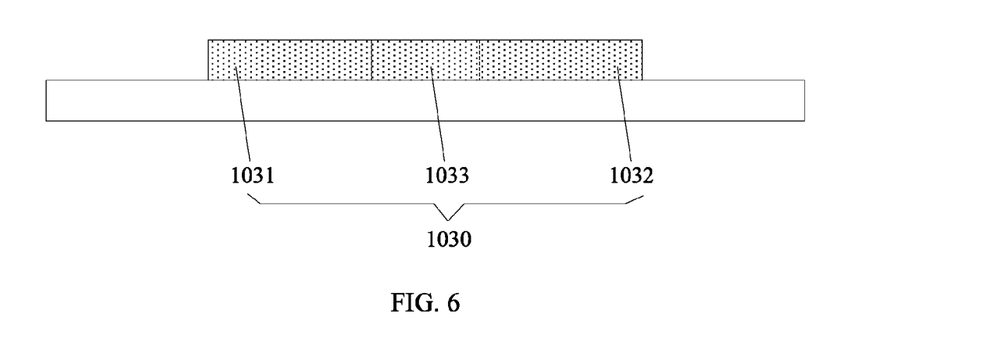
FIG. 6 to FIG. 8 are schematic views illustrating another process of forming a thin film transistor provided by an embodiment of the invention.

On the other hand, when the thin film transistor 10 is of a top-gate type, the zinc oxide-based binary metal oxide is AZO, and the metal doping ions are $Sn^{2+}$, the method specifically includes:

S201, as illustrated in FIG. 6, an AZO binary metal oxide thin film is formed on a base substrate, and is subjected to one patterning process, so as to form an AZO binary metal oxide pattern layer 1030.

The AZO binary metal oxide pattern layer 1030 includes a first pattern 1031 corresponding to the source electrode 104 to be formed, a second pattern 1032 corresponding to the drain electrode 105 to be formed, and a third pattern 1033 corresponding to a gap between the source electrode 104 and the drain electrode 105 that are to be formed.

Here, it is possible that an AZO metal oxide thin film with a thickness of 1000 Å to 6000 Å is deposited on a base substrate by using a chemical vapor deposition method; and is subjected to exposure, development, etching, stripping-off and other patterning process treatment with a mask, so as to form the AZO binary metal oxide pattern layer 1030.

Figure 7:
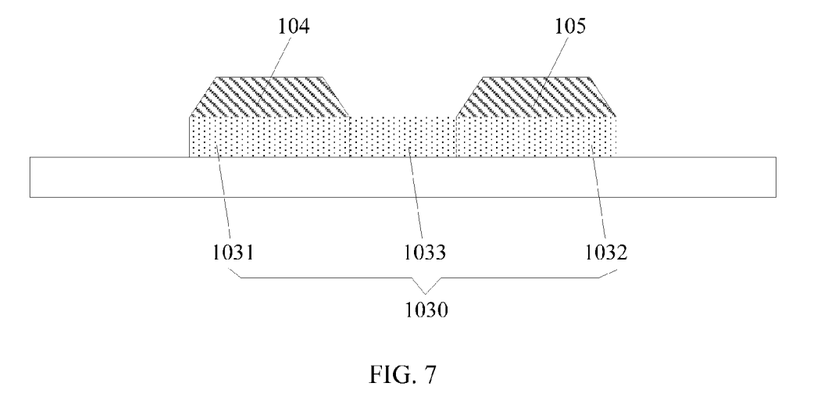

S202, as illustrated in FIG. 7, on the substrate subjected to the step S201, a source/drain metal layer thin film is formed, and subjected to one patterning process, so as to form a source electrode 104 and a drain electrode 105.

The first pattern 1031 and the second pattern 1032 of the AZO binary metal oxide pattern layer 1030 correspond to and contact directly with the source electrode 104 and the drain electrode 105, respectively.

Here, it is possible that a metal thin film with a thickness of 1000 Å to 7000 Å is deposited on the substrate with the AZO binary metal oxide pattern layer formed thereon by using a magnetron sputtering method; and then is subjected to exposure, development, etching, stripping-off and other patterning process treatment with a mask, so as to form the source electrode 104 corresponding to and in direct contact with the first pattern 1031, and the drain electrode 105 corresponding to and in direct contact with the second pattern 1032.

Figure 8:
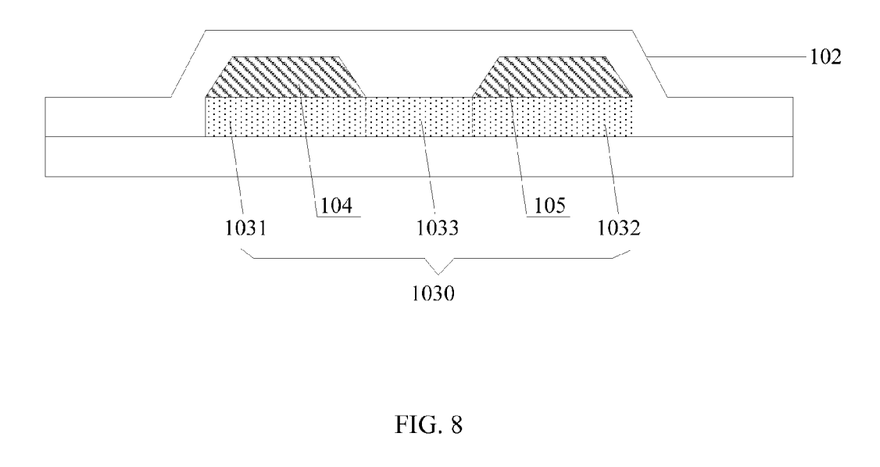

S203, as illustrated in FIG. 8, on the substrate subjected to the step S202, a gate insulating layer 102 is formed.

Here, a layer of insulating thin film with a thickness of 1000 Å to 6000 Å may be deposited on the substrate with the source electrode 104 and the drain electrode 105 formed thereon by using a chemical vapor deposition method. Material for the insulating thin film is usually silicon nitride, and silicon oxide, silicon oxynitride or other insulating material may also be used.

Figure 2:
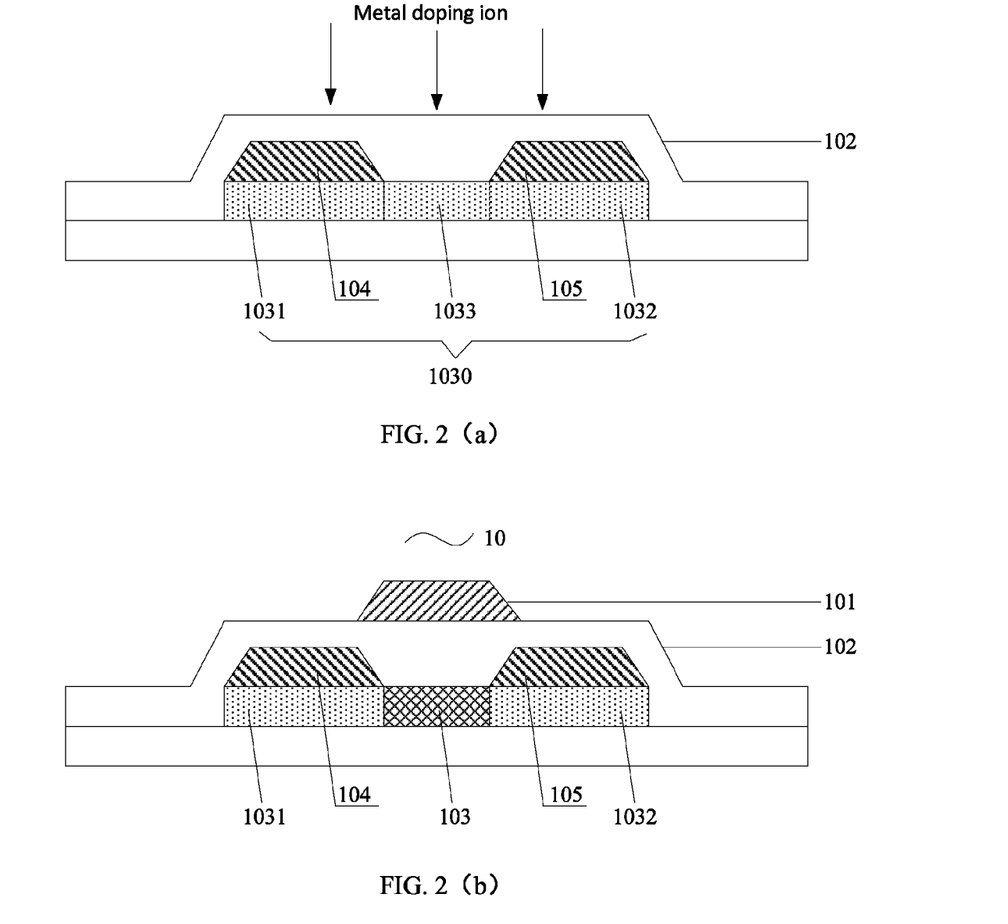

S204, referring to that illustrated in FIG. 2(*a*), with the gate insulating layer 102 as a barrier layer, $Sn^{2+}$ is implanted into the AZO binary metal oxide pattern layer 1030 by using an ion implantation technology, and an annealing treatment is conducted, so as to transform the AZO of the third pattern 1033 into the ATZO semiconductor. Thus, a metal oxide semiconductor active layer 103 is formed.

S205, referring to that illustrated in FIG. 2(*b*), a metal thin film is formed on the substrate subjected to the step S204, and subjected to one patterning process, so as to form a gate electrode 101.

At the same time that the gate electrode 101 is formed, a gate line, a gate-line lead wire and so on are formed besides. Of course, a common electrode line may also be formed.

Here, a layer of metal thin film with a thickness of 1000 Å to 7000 Å may be deposited on the substrate with the gate insulating layer 102 formed thereon by a magnetron sputtering method; and the metal thin film may usually adopt chromium, titanium, molybdenum, tungsten, aluminum, copper, an alloy of aluminum and nickel, an alloy of molybdenum and tungsten, an alloy of tungsten and copper or other metal or alloy material. Exposure, development, etching, stripping-off and other patterning process treatment are conducted with a mask, so as to form the gate electrode 101, the gate line (not illustrated in the figure), the gate-line lead wire and other pattern.

On the basis of the above steps S201 to S205, a thin film transistor 10 having a top-gate structure may be formed. The metal oxide semiconductor active layer 103 includes ATZO semiconductor, the source electrode 104 further includes the first pattern 1031, and the drain electrode 105 further includes the second pattern 1032.

Figure 1:
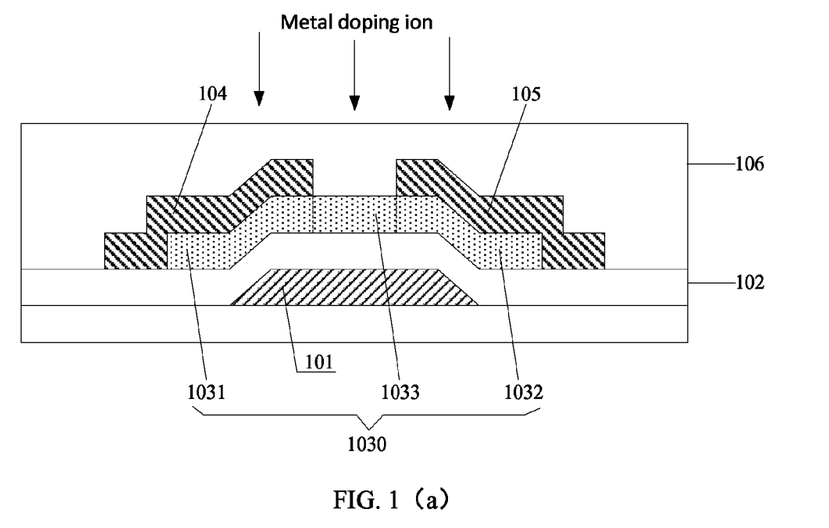

A thin film transistor 10 manufactured by using the above method is provided by embodiments of the invention. Referring to that illustrated in FIG. 1(*b*) and FIG. 2(*b*), it includes a gate electrode 101, a gate insulating layer 102, a metal oxide semiconductor active layer 103, a source electrode 104 and a drain electrode 105 that are provided on a substrate. The metal oxide semiconductor active layer 103 is disposed between the base substrate and the source electrode 104 and the drain electrode 105, and corresponds to a gap between the source electrode 104 and the drain electrode 105. The thin film transistor 10 further includes a first pattern 1031 and a second pattern 1032 that are disposed in the same layer as and contact with the metal oxide semiconductor active layer 103; the first pattern 1031 corresponds to and contacts directly with the source electrode 104, and the second pattern 1032 corresponds to and contacts directly with the drain electrode 105.

The first pattern 1031 and the second pattern 1032 each include a zinc oxide-based binary metal oxide, the metal oxide semiconductor active layer 103 includes a zinc oxide-based multi-element metal oxide semiconductor, and the zinc oxide-based multi-element metal oxide is a metal oxide obtained by injecting metal doping ions into the zinc oxide-based binary metal oxide.

It is to be noted that, the thin film transistor 10 may be a top-gate structure, and may also be a bottom-gate structure, and no limit will be set here. However, no matter how the structure of the thin film transistor 10 is, it is necessary for it to make sure that the first pattern 1031 and the second pattern 1032 as well as the metal oxide semiconductor active layer 103 are located below the source electrode 104 and the drain electrode 105. Thus, it is ensured that in the course of conducting an ion implantation, only the zinc oxide-based binary metal oxide corresponding to a gap between the source electrode 104 and the drain electrode 105 can be transformed into a zinc oxide-based multi-element metal oxide semiconductor.

The bottom-gate thin film transistor 10 refers to such a kind of thin film transistor that the gate electrode 101 is underneath and the source electrode 104, and the drain electrode 105 are on top; and the top-gate thin film transistor 10 refers to such a kind of thin film transistor that the gate electrode 101 is on top, and the source electrode 104 and the drain electrode 105 are underneath.

The first pattern 1031 contacts directly with the source electrode 104, the second pattern 1032 contacts directly with the drain electrode 105, and the first pattern 1031 and the second pattern 1032 each include the zinc oxide-based binary metal oxide conductive material. As such, a region for transition from conductor to semiconductor is formed below the source electrode 104 and the drain electrode 105. Thus, a transition layer for transmission of carriers is provided, and the problem of contact resistances between the metal oxide semiconductor active layer 103 and the source electrode 104 and the drain electrode 105 is solved effectively.

Optionally, referring to that illustrated in FIG. 1(b), when the thin film transistor 10 is of a bottom gate type, the thin film transistor 10 may include a gate electrode 101 disposed on a base substrate, a gate insulating layer 102 disposed over the gate electrode 101, a metal oxide semiconductor active layer 103 disposed over the gate insulating layer 102, a first pattern 1031 and a second pattern 1032 that are disposed in the same layer and contact with the metal oxide semiconductor active layer 103, a source electrode 104 and a drain electrode 105 that are disposed over the first pattern 1031 and the second pattern 1032, respectively, and a protective layer 106 disposed over the source electrode 104 and the drain electrode 105. The metal oxide semiconductor active layer 103 corresponds to a gap between the source electrode 104 and the drain electrode 105.

The first pattern 1031 and the second pattern 1032 each include a zinc oxide-based binary metal oxide, the metal oxide semiconductor active layer 103 includes a zinc oxide-based multi-element metal oxide semiconductor, and the zinc oxide-based multi-element metal oxide is a metal oxide obtained by injecting metal doping ions into the zinc oxide-based binary metal oxide.

Here, the zinc oxide-based binary metal oxide is a conductive material. Because the first pattern 1031 corresponds to and contacts directly with the source electrode 104, and the second pattern 1032 corresponds to and contacts directly with the drain electrode 105, it can be regarded that the source electrode 104 further includes the first pattern 1031, the drain electrode 105 further includes the second pattern 1032.

In addition, in view of the fact that the metal oxide semiconductor active layer 103 is formed by an ion implantation technology after the source electrode 104 and the drain electrode 105 are formed, while before the ion implantation, material of a portion corresponding to a gap between the source electrode 104 and the drain electrode 105 is a zinc oxide-based binary metal oxide that is not sensitive to a metal etching liquid, it is possible that preparation of an etch stop layer is omitted and metal etching is conducted directly. As compared with the prior art, one patterning process can be reduced in this way, thereby enhancing the mass-production efficiency, and saving the cost.

Optionally, referring to that illustrated in FIG. 2(b), when the thin film transistor 10 is of a top gate type, the thin film transistor 10 may include a metal oxide semiconductor active layer 103 disposed on a base substrate, a first pattern 1031 and a second pattern 1032 that are disposed in the same layer and contact with the metal oxide semiconductor active layer 103, a source electrode 104 and a drain electrode 105 that are disposed over the first pattern 1031 and the second pattern 1032, respectively, a gate insulating layer 102 disposed over the source electrode 104 and the drain electrode 105, and a gate electrode 101 disposed over the gate insulating layer 102. The metal oxide semiconductor active layer 103 corresponds to a gap between the source electrode 104 and the drain electrode 105.

Here, the zinc oxide-based binary metal oxide is a conductive material. Because the first pattern 1031 corresponds to and contacts directly with the source electrode 104, and the second pattern 1032 corresponds to and contacts directly with the drain electrode 105, it can be regarded that the source electrode 104 further includes the first pattern 1031, the drain electrode 105 further includes the second pattern 1032.

Further optionally, the zinc oxide-based binary metal oxide may include IZO, AZO, GZO or TZO; the metal doping ions may include at least one of $Ga^{3+}$, $Sn^{2+}$, $Hf^{4+}$, $Al^{3+}$, or $In^{3+}$.

On the basis of this, the zinc oxide-based binary metal oxide and the metal doping ions as stated above may be suitably combined, so that the best matching between characteristics of the resultant zinc oxide-based multi-element metal oxide semiconductor and the uses of the thin film transistor 10 can be achieved.

According to embodiments of the invention, there is provided a thin film transistor 10, including a gate electrode 101, a gate insulating layer 102, a metal oxide semiconductor active layer 103, a source electrode 104 and a drain electrode 105. The metal oxide semiconductor active layer 103 is provided between the substrate and the source electrode 104 and the drain electrode 105, and corresponds to a gap between the source electrode 104 and the drain electrode 105. The thin film transistor 10 further includes a first pattern 1031 and a second pattern 1032 that are disposed in the same layer and contact with the metal oxide semiconductor active layer 103; the first pattern 1031 corresponds to and contacts directly with the source electrode 104, and the second pattern 1032 corresponds to and contacts directly with the drain electrode 105. The first pattern 1031 and the second pattern 1032 each include a zinc oxide-based binary metal oxide, the metal oxide semiconductor active layer 103 includes a zinc oxide-based multi-element metal oxide semiconductor, and the zinc oxide-based multi-element metal oxide is a metal oxide obtained by injecting metal doping ions into the zinc oxide-based binary metal oxide.

As regards the thin film transistor 10 provided by embodiments of the invention, the first pattern 1031 and the second pattern 1032 are disposed in the same layer and contact with the metal oxide semiconductor active layer 103, and the metal oxide semiconductor active layer 103 corresponds to a gap between the source electrode 104, and the drain electrode 105. The first pattern 1031 corresponds to and contacts directly with the source electrode 104, the second pattern 1032 corresponds to and contacts directly with the drain electrode 105, and the first pattern 1031 and the second pattern 1032 each include the zinc oxide-based binary metal oxide conductive material. As such, it amounts to forming a region for transition from conductor to semiconductor below the source electrode 104 and the drain electrode 105. Thus, a transition layer, with which transmission of carriers can be provided, is formed, and the problem of contact resistances between the metal oxide semiconductor active layer 103 and the source electrode 104 and the drain electrode 105 is solved effectively.

According to embodiments of the invention, there is provided an array substrate, including the above thin film transistor 10.

Figure 9:
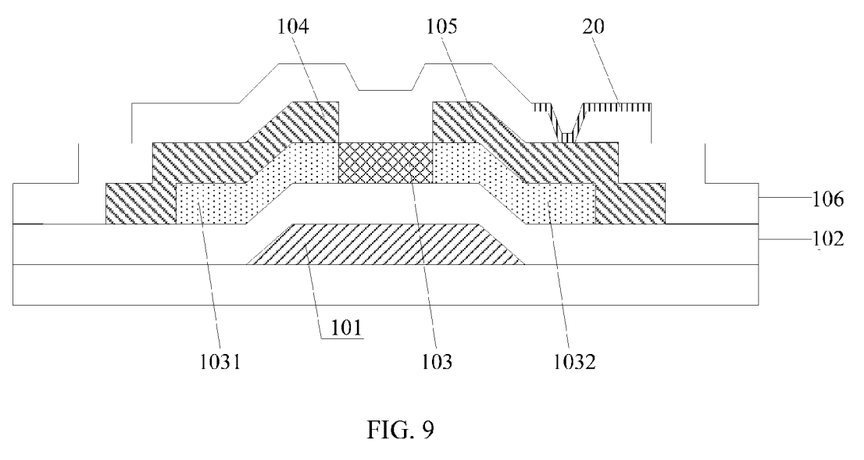
FIG. 9 is a structurally schematic view illustrating an array substrate provided by the invention.

Here, when the array substrate is applied to a liquid crystal display device. As illustrated in FIG. 9, the array substrate further includes a pixel electrode 20 electrically connected to the drain electrode 105 of the thin film transistor 10.

Of course, it may further include a common electrode and so on.

In addition, when the array substrate is applied to an organic electroluminescent device, the array substrate further includes a cathode, and an anode. Certainly, a planarizing layer, a pixel defining layer and so on may also be produced according to requirements.

The pixel defining layer acts to guarantee that droplets of a luminous material can be smoothly spread within a whole pixel region, and are avoided from flowing to an adjacent pixel region, when a light emitting layer is formed by a printing technology.

According to an embodiment of the invention, there is further provided a display device, including the above array substrate.

The display device may be a liquid crystal panel, an OLED, an electronic paper, a liquid crystal television, a liquid crystal display, a digital photo frame, a cell phone, a tablet computer, or other product or component having any display function.

Descriptions made above are merely exemplary embodiments of the invention, but are not used to limit the protection scope of the invention. The protection scope of the invention is determined by attached claims.

The invention claimed is:

1. A thin film transistor, comprising a gate electrode, a gate insulating layer, a metal oxide semiconductor active layer, a source electrode and a drain electrode that are provided on a substrate; wherein,
the metal oxide semiconductor active layer is disposed between the substrate and the source electrode and the drain electrode, and corresponds to a gap between the source electrode and the drain electrode;
the thin film transistor further includes a first pattern and a second pattern that are disposed in the same layer and contact with the metal oxide semiconductor active layer;
the first pattern corresponds to and contacts directly with the source electrode, and the second pattern corresponds to and contacts directly with the drain electrode;
wherein, the first pattern and the second pattern each include a zinc oxide-based binary metal oxide, the metal oxide semiconductor active layer includes a zinc oxide-based multi-element metal oxide semiconductor, and the zinc oxide-based multi-element metal oxide is a metal oxide obtained by injecting metal doping ions into the zinc oxide-based binary metal oxide.

2. The thin film transistor according to claim 1, wherein, in a cross section taken along an interval direction of the source electrode and the drain electrode, the metal oxide semiconductor active layer has a width the same as a gap width between the source electrode and the drain electrode.

3. The thin film transistor according to claim 2, wherein, the thin film transistor is of bottom gate type;
the thin film transistor further includes a protective layer disposed over the source electrode and the drain electrode.

4. The thin film transistor according to claim 2, wherein, the thin film transistor is of top gate type.

5. The thin film transistor according to claim 2, wherein, the zinc oxide-based binary metal oxide includes indium zinc oxide IZO, aluminum zinc oxide AZO, gallium zinc oxide GZO or tin zinc oxide TZO;
the metal doping ions include at least one of gallium ions $Ga^{3+}$, tin ions $Sn^{2+}$, hafnium ions $Hf^{4+}$, aluminum ions $Al^{3+}$ or indium ions $In^{3+}$.

6. The thin film transistor according to claim 2, wherein, in a cross section along an interval direction of the source electrode and the drain electrode, edges at both sides of the metal oxide semiconductor active layer are aligned with edges of the source electrode and the drain electrode in opposition, respectively.

7. The thin film transistor according to claim 1, wherein, the thin film transistor is of bottom gate type;
the thin film transistor further includes a protective layer disposed over the source electrode and the drain electrode.

8. The thin film transistor according to claim 7, wherein, the zinc oxide-based binary metal oxide includes indium zinc oxide IZO, aluminum zinc oxide AZO, gallium zinc oxide GZO or tin zinc oxide TZO;
the metal doping ions include at least one of gallium ions $Ga^{3+}$, tin ions $Sn^{2+}$, hafnium ions $Hf^{4+}$, aluminum ions $Al^{3+}$ or indium ions $In^{3+}$.

9. The thin film transistor according to claim 1, wherein, the thin film transistor is of top gate type.

10. The thin film transistor according to claim 1, wherein, the zinc oxide-based binary metal oxide includes indium zinc oxide IZO, aluminum zinc oxide AZO, gallium zinc oxide GZO or tin zinc oxide TZO;
the metal doping ions include at least one of gallium ions $Ga^{3+}$, tin ions $Sn^{2+}$, hafnium ions $Hf^{4+}$, aluminum ions $Al^{3+}$ or indium ions $In^{3+}$.

11. The thin film transistor according to claim 1, wherein, in a cross section along an interval direction of the source electrode and the drain electrode, edges at both sides of the metal oxide semiconductor active layer are aligned with edges of the source electrode and the drain electrode in opposition, respectively.

12. An array substrate, comprising the thin film transistor according to claim 1.

13. A manufacturing method of a thin film transistor, comprising forming a gate electrode, a gate insulating layer, a metal oxide semiconductor active layer, a source electrode and a drain electrode on a substrate; wherein,
forming the metal oxide semiconductor active layer on the substrate includes:
forming a zinc oxide-based binary metal oxide pattern layer on the substrate, wherein, the pattern layer includes a first pattern corresponding to the source electrode, a second pattern corresponding to the drain electrode, and a third pattern corresponding to a gap between the source electrode and the drain electrode, and the zinc oxide-based binary metal oxide pattern layer contacts directly with the source electrode and the drain electrode; and
with an insulating layer formed above the source electrode and the drain electrode as a barrier layer, implanting metal doping ions into the zinc oxide-based binary metal oxide pattern layer by using an ion implantation technology, so that the zinc oxide-based binary metal oxide of the third pattern is transformed into a zinc oxide-based multi-element metal oxide semiconductor, and the metal oxide semiconductor active layer is formed.

14. The method according to claim 13, wherein, the thin film transistor is of bottom gate type;
the method further includes forming a protective layer on the substrate with the source electrode and the drain electrode formed thereon;
wherein, implanting metal doping ions into the zinc oxide-based binary metal oxide pattern layer by using an ion implantation technology with the insulating layer formed above the source electrode and the drain electrode as a barrier layer, so that the zinc oxide-based binary metal oxide of the third pattern is transformed into the zinc oxide-based multi-element metal oxide semiconductor, and the metal oxide semiconductor active layer is formed, includes:
with the protective layer as a barrier layer, implanting metal doping ions into the zinc oxide-based binary metal oxide pattern layer by using an ion implantation technology, so that the zinc oxide-based binary metal oxide of the third pattern that is not blocked by the source electrode and the drain electrode is transformed into the zinc oxide-based multi-element metal oxide semiconductor, and the metal oxide semiconductor active layer is formed.

15. The method according to claim 14, wherein, after implanting metal doping ions into the zinc oxide-based binary metal oxide pattern layer by using an ion implantation technology, the method further includes conducting an annealing treatment.

16. The method according to claim 14, wherein,
the zinc oxide-based binary metal oxide includes indium zinc oxide IZO, aluminum zinc oxide AZO, gallium zinc oxide GZO or tin zinc oxide TZO;
the metal doping ions include at least one of gallium ions $Ga^{3+}$, tin ions $Sn^{2+}$, hafnium ions $Hf^{4+}$, aluminum ions $Al^{3+}$ or indium ions $In^{3+}$.

17. The method according to claim 13, wherein, the thin film transistor is of top gate type;
wherein, implanting metal doping ions into the zinc oxide-based binary metal oxide pattern layer by using an ion implantation technology with the insulating layer formed above the source electrode and the drain electrode as a barrier layer, so that the zinc oxide-based binary metal oxide of the third pattern is transformed into the zinc oxide-based multi-element metal oxide semiconductor, and the metal oxide semiconductor active layer is formed, includes:
with the gate insulating layer as a barrier layer, implanting metal doping ions into the zinc oxide-based binary metal oxide pattern layer by using an ion implantation technology, so that the zinc oxide-based binary metal oxide of the third pattern that is not blocked by the source electrode and the drain electrode is transformed into the zinc oxide-based multi-element metal oxide semiconductor, and the metal oxide semiconductor active layer is formed.

18. The method according to claim 13, wherein, after implanting metal doping ions into the zinc oxide-based binary metal oxide pattern layer by using an ion implantation technology, the method further includes conducting an annealing treatment.

19. The method according to claim 13, wherein,
the zinc oxide-based binary metal oxide includes indium zinc oxide IZO, aluminum zinc oxide AZO, gallium zinc oxide GZO or tin zinc oxide TZO;
the metal doping ions include at least one of gallium ions $Ga^{3+}$, tin ions $Sn^{2+}$, hafnium ions $Hf^{4+}$, aluminum ions $Al^{3+}$ or indium ions $In^{3+}$.

* * * * *